United States Patent [19]

Hofmann et al.

[11] Patent Number: 4,806,449

[45] Date of Patent: Feb. 21, 1989

[54] PHOTOSENSITIVE PHOTOPOLYMERIZABLE RECORDING ELEMENT CONTAINING A TERPOLYMER BINDER

[75] Inventors: Reiner Hofmann, Neustadt; Axel Sanner, Frankenthal, both of Fed. Rep. of Germany

[73] Assignee: BASF Aktiengesellschaft, Ludwigshafen, Fed. Rep. of Germany

[21] Appl. No.: 54,992

[22] Filed: May 28, 1987

[30] Foreign Application Priority Data

Jun. 6, 1986 [DE] Fed. Rep. of Germany ....... 3619129

[51] Int. Cl.$^4$ .................................... G03C 1/76
[52] U.S. Cl. .................................... 430/281; 430/286; 430/287; 430/906; 430/910
[58] Field of Search ............... 430/906, 910, 281, 286, 430/287, 905

[56] References Cited

U.S. PATENT DOCUMENTS

| | | |
|---|---|---|
| 3,751,259 | 8/1973 | Bauer et al. . |
| 3,796,578 | 3/1974 | Hosoi et al. . |
| 3,887,450 | 6/1975 | Gilano et al. ................. 430/910 |
| 3,953,309 | 4/1983 | Gilano et al. . |
| 4,162,274 | 7/1979 | Rosenkranz . |
| 4,228,232 | 10/1980 | Rousseau . |
| 4,234,675 | 11/1980 | Kuznetsov . |
| 4,289,865 | 9/1981 | Wilson et al. ................. 430/910 |
| 4,293,635 | 10/1981 | Flint et al. ................. 430/910 |
| 4,304,923 | 12/1981 | Rousseau . |
| 4,427,760 | 1/1984 | Nagazawa et al. ............ 430/910 |
| 4,485,167 | 11/1984 | Briney et al. . |
| 4,517,281 | 5/1985 | Briney et al. . |
| 4,537,855 | 8/1985 | Ide ................................. 430/910 |
| 4,557,997 | 12/1985 | Iwasaki et al. ................ 430/910 |
| 4,606,993 | 8/1986 | Fujikawa et al. .............. 430/910 |

FOREIGN PATENT DOCUMENTS

| | | |
|---|---|---|
| 0049504 | 7/1970 | European Pat. Off. . |
| 2736058 | 3/1969 | Fed. Rep. of Germany . |
| 2027467 | 7/1970 | Fed. Rep. of Germany . |
| 2917483 | 5/1974 | Fed. Rep. of Germany . |
| 2442527 | 8/1976 | Fed. Rep. of Germany . |
| 2205146 | 1/1980 | Fed. Rep. of Germany . |
| 2557408 | 4/1981 | Fed. Rep. of Germany . |
| 1489425 | 10/1977 | United Kingdom . |

*Primary Examiner*—Jack P. Brammer
*Attorney, Agent, or Firm*—Keil & Weinkauf

[57] ABSTRACT

A photosensitive recording element which is suitable for the production of printing plates or resist images possesses a photopolymerizable recording layer which is applied to a dimensionally stable base, can be developed in an aqueous alkaline medium and contains, as a polymeric binder, one or more film-forming copolymers which are insoluble in water but soluble or dispersible in aqueous alkaline solutions and consist of from 10 to 50% by weight of one or more N-vinylamides, from 8 to 30% by weight of acrylic acid and/or methacrylic acid and from 30 to 80% by weight of one or more hydrophobic comonomers which, as such, form homopolymers which are insoluble in water and aqueous alkaline solutions, some of the carboxyl groups of the copolymer being esterified by reaction with glycidyl (meth)acrylate.

4 Claims, No Drawings

PHOTOSENSITIVE PHOTOPOLYMERIZABLE RECORDING ELEMENT CONTAINING A TERPOLYMER BINDER

The present invention relates to a photosensitive recording element having a photopolymerizable recording layer which is applied to a base, can be developed in an aqueous alkaline medium, contains a polymeric binder and is particularly suitable for the production of printing plates or resist images.

The known photosensitive recording elements which can be washed out with aqueous alkaline developers and are suitable for the production of photopolymeric printing plates or resist images contain, on a dimensionally stable base, for example a plastic film or a metal sheet, a photopolymerizable recording layer which in general consists of a mixture of one or more polymeric binders which are soluble or dispersible in the aqueous alkaline developers, one or more ethylenically unsaturated, photopolymerizable, low molecular weight compounds and one or more photoinitiators, with or without further additives and/or assistants which improve and/or modify the processing properties and/or performance characteristics.

Polymeric binders used for the photopolymerizable recording layers which can be developed in aqueous alkaline media are, in particular, carboxyl-containing or carboxylic anhydride-containing copolymers which are soluble or dispersible in the aqueous alkaline developers, for example styrene/maleic anhydride copolymers, styrene/maleic half ester copolymers, alkyl (meth)acrylate/(meth)acrylic acid copolymers or copolymers of styrene, alkyl (meth)acrylates and (meth)acrylic acid and, if appropriate, other comonomers (cf. inter alia DE-B-No. 20 27 467, USSR patent No. 190,211, DE-A-No. 22 05 146, EP-A-No. 49 504 or DE-A-No. 27 36 058).

U.S. Pat. No. 3,796,578 describes photopolymerizable mixtures of esterification products of carboxyl-containing copolymers with ethylenically unsaturated compounds which carry an oxirane ring, an ethylenically unsaturated compound and a photopolymerization initiator, and their use for the production of offset printing plates. However, the compatibility of these products is still unsatisfactory.

It is also known that photopolymerizable mixtures which, in addition to photopolymerizable monomers, one or more photoinitiators and, if required, further additives and/or assistants, contain vinylpyrrolidone polymers, for example polyvinylpyrrolidone or vinylpyrrolidone/vinyl acetate copolymers, as polymeric binders can be used for the production of photopolymeric printing plates or relief plates (cf. for example DE-A-No. 17 97 373). These photopolymerizable mixtures can be developed with aqueous solvents, in particular pure water.

Although the known photosensitive recording materials which can be developed in an aqueous medium are already useful for many purposes, a number of their properties are still unsatisfactory. For example, in the photopolymerized state, they are frequently too sensitive to the washout medium, ie. the sensitivity to overwashing during development is high, or the printing plates or resist images produced from them are not sufficiently resistant to the aqueous media employed when they are used. Many fine image elements are difficult to reproduce using these recording materials, and the washout conditions such as washout time, temperature and composition of the developer have to be kept within very narrow limits. Furthermore, residual layers are readily formed during development in the case of the known materials which can be developed in aqueous alkaline media, ie. the parts of the recording layer which are not photopolymerized during imagewise exposure cannot be removed completely and satisfactorily from the base. This phenomenon, which occurs in particular where metallic bases or substrates are used for the photopolymerizable recording layer, is particularly troublesome in the production of resist images and lithographic printing plates. Furthermore, the conventional polymeric binders for the photopolymerizable recording materials which can be developed in an aqueous alkaline medium have only limited compatibility with the conventional photopolymerizable compounds used in these recording materials, with the result that either the range of use of the photopolymerizable compounds is limited or the exposure properties of the photopolymerizable recording layers are unsatisfactory in practice.

It is an object of the present invention to provide novel photosensitive recording elements which have a photopolymerizable recording layer developable in aqueous alkaline media, possess better compatibility and are more suitable for the production of photopolymeric printing plates or resist images. It is a particular object of the present invention to provide photosensitive recording elements which have good developability and a very wide development latitude during washout with aqueous alkaline developers and, in the exposed state, also have high resistance to aqueous media, including weakly alkaline aqueous solutions, without their general property profile being adversely affected. The said recording layers should exhibit particularly good adhesion to metallic bases or substrates without forming residual layers during processing. Very generally, the said recording elements should have good processing properties and performance characteristics, for example good exposure properties, should permit exact and reliable reproduction of fine image elements too, should have a wide range of uses and should be capable of being readily and optimally adapted for different purposes.

We have found, surprisingly, that this object is achieved by photosensitive recording elements which have a photopolymerizable recording layer which is applied to a dimensionally stable base and can be developed in an aqueous alkaline medium, if the said recording layer contains, as the polymeric binder, one or more film-forming copolymers which are insoluble in water but soluble or dispersible in aqueous alkaline solutions and consist of, in copolymerized form, from 10 to 50% by weight of one or more N-vinylamides, from 8 to 30% by weight of acrylic acid and/or methacrylic acid and from 30 to 80% by weight of one or more hydrophobic comonomers which as such form homopolymers which are insoluble in water and aqueous alkaline solutions, and some of the carboxyl groups of the copolymer are esterified by reaction with glycidyl acrylate or glycidyl methacrylate.

The present invention accordingly relates to a photosensitive recording element which is suitable for the production of photopolymeric printing plates or resist images and has a photopolymerizable recording layer which is applied to a dimensionally stable base, can be developed in an aqueous alkaline medium and contains a polymeric binder, wherein the said recording layer contains, as the polymeric binder, one or more film-forming copolymers which are insoluble in water but soluble or dispersible in aqueous alkaline solutions and consist of from 10 to 50% by weight of one or more N-vinylamides, from 8 to 30% by weight of acrylic acid and/or methacrylic acid and from 30 to 80% by weight of one or more hydrophobic comonomers which as such form homopolymers which are insoluble in water and aqueous alkaline solutions, with the proviso that some of the carboxyl groups of the copolymer are esterified by reaction with glycidyl acrylate or glycidyl methacrylate.

The polymeric binder therefore contains, as copolymerized units, (a) from 10 to 50% by weight of one or more N-vinylamides, (b) from 8 tb 30% by weight of acrylic acid and/or methacrylic acid and (c) from 30 to 80% by weight of one or more hydrophobic comonomers which as such form homopolymers which are insoluble in water and aqueous alkaline solutions, the sum of the percentages stated under (a) to (c) being 100, with the proviso that some of the carboxyl groups of the copolymer, preferably from 10 to 60% of these groups, are esterified by reaction with glycidyl acrylate or glycidyl methacrylate.

The use, according to the invention, of the special N-vinylamide copolymers as a polymeric binder in the photopolymerizable recording layers gives photosensitive recording elements having very advantageous properties. Particularly suitable recording elements are those in which 5 from 10 to 60% of the carboxyl groups of the copolymer are esterified with glycidyl (meth)acrylate, and those whose copolymers partially esterified with glycidyl (meth)acrylate have acid numbers of from 20 to 100 mg of KOH/g. Because of the good compatibility of the copolymers, to be used according to the invention, with photopolymerizable monomers and oligomers, a wide variety of such photopolymerizable monomers and/or oligomers, including polyfunctional ones, can be used, even in large amounts, in the photopolymerizable recording layers. Consequently, the property spectrum of the printing plates or resist images produced using the novel recording elements can simply and readily be varied. In spite of good developability in purely aqueous alkaline developers, the recording materials in the photopolymerized state have good resistance to aqueous media, as employed, for example, during use of the printing plates and in particular when resist images are used in etching or electroplating. The novel photosensitive recording elements have little sensitivity to overwashing, the photopolymerizable recording layer is also stable on metallic bases or substrates and simultaneously exhibits good adhesion to these bases or substrates, and the said recording elements permit exact and reliable reproduction of fine image elements too, for example lines having a width of 100 μm or less. Because of the good differentiation in the adhesion of the novel photopolymerizable recording layers, the said recording elements can also advantageously be used as a dry film resist for dry lamination.

The polymeric binders present according to the invention in the photopolymerizable recording layer of the photosensitive recording elements are carboxyl-containing N-vinylamide copolymers in which some of the carboxyl groups are esterified with glycidyl acrylate or glycidye methacrylate and which are insoluble in pure water but soluble or dispersible. in aqueous alkaline solutions. Preferably, the N-vinylamide copolymers modified in this manner are soluble or dispersible in aqueous alkaline solutions having a pH greater than about 9, in particular about 9–13, but insoluble in aqueous alkaline solutions having a pH of less than about 9. The copolymers to be used according to the invention should moreover be film-forming and generally have a mean weight average molecular weight greater than about 10,000, preferably from about 15,000 to about 500,000, in particular from about 20,000 to 250,000.

The copolymers to be used according to the invention, and obtained by partial esterification of the carboxyl groups with glycidyl (meth)acrylate are usually obtained by copolymerization of N-vinylamides, acrylic acid and/or methacrylic acid and hydrophobic comonomers which as such form homopolymers which are insoluble in water and in aqueous alkaline solutions, and esterification of some of the carboxyl groups of the copolymer by glycidyl acrylate or glycidyl methacrylate. Hydrophobic comonomers which have proven advantageous are those which, as such, are capable of forming homopolymers having a glass transition temperature (measured by the DSC method) greater than 300°K, in particular greater than 320°K. The comonomers for the preparation of the copolymers to be used according to the invention should of course be copolymerizable with one another.

Examples of suitable N-vinylamides are the N-vinyl derivatives of aliphatic carboxamides, eg. N-vinylformamide, N-vinylacetamide or N-vinyl-N-methylacetamide. The copolymers to be used according to the invention preferably contain N-vinyllactams, in particular N-vinylpyrrolidone and/or N-vinylcaprolactam, as copolymerized N-vinylamide comonomers. The copolymers may contain one or more of the N-vinylamide comonomers as copolymerized units, the amount of these N-vinylamide comonomer units copolymerized in the copolymer being from 10 to 50, preferably from 20 to 45, % by weight, based on the copolymer.

The copolymer contains, as a second group of comonomers, acrylic acid and/or methacrylic acid an an amount from 8 to 30, in particular from 10 to 25, % by weight, based on the copolymer, as copolymerized units.

Examples of the hydrophobic comonomers which are present as the third copolymerized component in the copolymer are vinyl aromatics, eg. styrene, substituted styrenes, which are substituted in the side chain or in the nucleus by, for example, alkyl or halogen, eg. o-methylstyrene, p-methylstyrene and the like, vinyl acetate and the esters of acrylic acid and methacrylic acid, in particular the acrylates and methacrylates of straight-chain or branched monoalkanols, preferably those of 1 to 4 carbon atoms, methyl methacrylate being among the particularly advantageous compounds of this type. The copolymer may contain one or more of the hydrophobic comonomers as copolymerized units, the amount of hydrophobic comonomer units in the copolymer being from 30 to 80, preferably from 40 to 70, % by weight, based on the copolymer.

Examples of copolymers which, after partial esterification of the carboxyl groups with glycidyl (meth)acrylate, have proven particularly advantageous for use, according to the invention, as polymeric binders in the photopolymerizable recording layers of the photosensitive recording elements include N-vinyllactam/(meth)acrylic acid/methyl methacrylate copolymers or N-vinyllactam/ (meth)acrylic acid/styrene copolymers. In a typical embodiment, these copolymers contain, for example, from 25 to 35% by weight of N-vinylcaprolactam and/or N-vinylpyrrolidone, from 10 to 15% by weight of (meth)acrylic acid and from 55 to 65% by weight of the hydrophobic comonomers, based in each case on the copolymer, as copolymerized units.

The type and amount of the comonomers for the copolymers to be used according to the invention are chosen, within the abovementioned general range, so that, after some, preferably from 10 to 60%, of the carboxyl groups have been esterified with glycidyl (meth)acrylate, the copolymers are film-forming and meet the requirements set in respect of their solubility or dispersibility. The limits for the amount of the individual comonomer groups are important with regard to the general properties of the copolymers and in particular of the novel photosensitive recording elements produced from them. If the content of the individual comonomers in the copolymers and their degree of esterification with glycidyl (meth)acrylate are outside these limits, the properties of the said recording elements and of the printing plates or resist images produced from them are adversely affected.

The novel copolymers partially esterified with glycidyl (meth)acrylate preferably have acid numbers of from 20 to 100 mg of KOH/g.

The copolymers to be used according to the invention as polymeric binders can be prepared by a conventional polymerization method, by copolymerization of the comonomers, for example in solution. Examples of suitable solvents for the solution polymerization are lower alkanols, ketones, esters and the like, such as methanol, acetone, methyl ethyl ketone, ethyl acetate, etc. Suitable polymerization initiators are the conventional free radical initiators, for example azobisisobutyronitrile, benzoyl peroxide and the like.

The esterification with glycidyl acrylate and/or glycidyl methacrylate can be carried out in general in a conventional manner by reacting the carboxyl-containing copolymers with glycidyl (meth)acrylate in solution at from 70° to 110° C.

Functionalization of the carbpxyl-containing copolymers with glycidyl (meth)acrylate can advantageously be carried out as follows:

From 10 to 20% strength solutions of the carboxyl-containing copolymers in diethylene glycol dimethyl ether are initially taken, and a solution consisting of 30 parts of glycidyl (meth)acrylate 2 parts of a thermal polymerization inhibitor (eg. Xyligen ® A1) and 2 parts of a catalyst (eg. dimethylaminopyridine, N-methylimidazole or tetrabutylammonium iodide) is added dropwise in the course of about 2 hours at about 110° C. The reaction is generally complete after about 3.5 hours. The cold reaction mixture can then be diluted to a solids content of 1–5% and precipitated in water.

Depending on the conversion of the carboxyl groups of the copolymer, binders having various acid numbers can be prepared in a selective manner. This has the advantage that the binder can be brought to the pH of the developer without difficulty (for example, acid number 90, developable at pH 11; acid number 25, developable at pH 12.5).

The photopolymerizable recording layer of the novel photosensitive recording elements may contain one or more N-vinylamide copolymers of the type under discussion, as polymeric binders. In addition to the polymeric binder, the said layer generally contains one or more ethylenically unsaturated, photopolymerizable compounds and one or more photopolymerization initiators or a photopolymerization initiator system, with or without further additives and/or assistants for improving and/or modifying the general properties of photosensitive recording elements or of the printing plates or resist images produced from them.

Suitable ethylenically unsaturated, photopolymerizable compounds are both monomers and ethylenically unsaturated, photopolymerizable oligomers. The monomers generally have a molecular weight of less than 1,000. The mean molecular weight (number average) of the photopolymerizable oligomers is preferably about 1,000–10,000, in particular about 1,500–6,000. The photopolymerizable monomers and oligomers may be either monofunctional or polyfunctional, ie. may possess one or more photopolymerizable, ethylenic double bonds. Usually, the photopolymerizable recording layer contains bifunctional or polyfunctional ethylenically unsaturated, photopolymerizable compounds alone or as a mixture with a minor amount of monofunctional ethylenically unsaturated, photopolymerizable compounds. Because of the good compatibility of the special N-vinylamide copolymers to be used according to the invention as a polymeric binder, suitable photopolymerizable compounds in the novel photosensitive recording elements include a large number of monomers and oligomers, which may be used alone or as a mixture with one another.

Typical examples of the photopolymerizable monomers are, in particular, the derivatives of (meth)acrylic acid and very particularly the (meth)acrylates. Examples of these are the di- and tri(meth)acrylates of ethylene glycol, diethylene glycol, triethylene glycol or polyethylene glycols having a molecular weight up to about 500, propane-1,2-diol, propane-1,3-diol, polypropylene glycols having a molecular weight up to about 500, butane-1,4-diol, 1,1,1-trimethylolpropane, 2,2-dimethylpropanediol, glycerol or pentaerythritol; pentaerythritol tetra(meth)acrylate, glucose tri- or tetra(meth)acrylate, and the monoacrylates and monomethacrylates of the stated diols and polyols, eg. ethylene glycol mono(meth)acrylate, di-, tri- or tetraethylene glycol mono(meth)acrylate, propanediol mono(meth)acrylate and butanediol mono(meth)acrylate, and the (meth)acrylates of monoalkanols, in particular those of 1 to 20 carbon atoms. In addition to the preferred acrylates and methacrylates of the abovementioned type, further examples of photopolymerizable monomers are the allyl compounds and other vinyl compounds, eg. N-vinylpyrrolidone, N-vinylcaprolactam, vinyl acetate, vinyl propionate, (meth)acrylamide, N-methylol(meth)acrylamide, the bisethers of ethylene glycol and N-methylol(meth)acrylamide, vinylcarbamates, bisacrylamidoacetic acid, glyoxalbisamide and others.

Other very suitable ethylenically unsaturated, photopolymerizable compounds for the novel photosensitive recording elements are the monomeric urethane acrylates and methacrylates possessing two or more acryloyl and/or methacryloyl groups. Such monomeric urethane (meth)acrylates can be obtained, for example, by reacting aliphatic di- or polyols with organic diisocyanates in a ratio such that the number of equivalents of OH to that of NCO is about 1:2, and then reacting the free isocyanate groups of the resulting reaction product with suitable acryloyl and/or methacryloyl compounds, for example hydroxyalkyl (meth)acrylates. Suitable aliphatic di- or polyols include the di- and polyhydroxy compounds stated above in connection with the di- and tri(meth)acrylates; examples of organic diisocyanates are hexamethylene diisocyanate, toluylene diisocyanate, isophorone diisocyanate and the like; hydroxyalkyl (meth)acrylates are, for example, hydroxyethyl (meth)acrylate, propanediol mono(meth)acrylate and butanediol mono(meth)acrylate. Monomers containing two or more acryloyl and/or methacryloyl groups, as can be obtained, for example, by reacting di- or polyglycidyl compounds with acrylic acid and/or methacrylic acid, are just as suitable and advantageous. Particularly suitable di- and polyglycidyl compounds here are the di- and polyglycidyl ethers of polyhydric phenols, for example those of bisphenol A or of the substitution products of bisphenol A. Examples of such monomers containing acryloyl and/or methacryloyl groups are the reaction products of bisphenol A bisglycidyl ether with acrylic and/or methacrylic acid in a molar ratio of about 1:2.

It has proven particularly advantageous, particularly for the production of resist images, if the photosensitive recording elements in the photopolymerizable recording layer contain, as photopolymerizable compounds, oligomers having 2, or preferably more than 2, acryloyl and/or methacryloyl groups. These may be, for example, oligomeric urethane resins containing acryloyl and/or methacryloyl groups or those based on di- or polyepoxides, as are known and described in the literature. Of particular interest in this respect are those oligomers of the type under discussion which contain not only acryloyl and/or methacryloyl groups but also free carboxyl groups in the molecule. The amount of the free carboxyl groups in these photopolymerizable oligomers is advantageously sufficiently high for the oligomers to have an acid number of from 50 to 150 mg of KOH/g. Suitable photopolymerizable oligomers of this type, as may also be present in the said recording elements, are described in, for example, DE-A-No. 24 42 527, DE-C-No. 25 57 408 or DE-A-No. 29 17 483. Other photopolymerizable oligomers whose use in the novel photosensitive recording elements has given particularly advantageous results can be prepared, for example, by a method in which the hydroxyl groups of a diol or polyol compound containing acryloyl and/or methacryloyl groups are reacted with polybasic carboxylic acids or their derivatives, in particular cyclic carboxylic anhydrides, in such a way that the acidic partial esters of the polybasic carboxylic acids are formed, and some of the free carboxyl groups of the resulting reaction product are then reacted with di- and/or polyepoxides with chain extension and, if appropriate, branching. The said diol or polyol compounds which serve as a starting material for the preparation of such oligomers are advantageously prepared by reacting di- or polyepoxide compounds, for example di- or polyglycidyl ethers or di- or polyglycidyl esters with acrylic acid and/or methacrylic acid in a ratio such that the number of equivalents of glycidyl groups to that of COOH groups is about 1:1. Furthermore, the di- or polyepoxide compounds can, for example, be subjected to a preliminary chain-extending reaction with dicarboxylic acids before or during the reaction with the (meth)acrylic acid. Typical examples of oligomers of the last-mentioned type are the products obtainable by reacting bisphenol A bisglycidyl ethers with acrylic and/or methacrylic acid or with a mixture of about 30–70 mol % of a dicarboxylic acid, for example adipic acid, and about 30–70 mol % of acrylic and/or methacrylic acid in a ratio such that the number of equivalents of glycidyl groups to the total number of equivalents of COOH is about 1:1, reacting the hydroxyl groups of the resulting reaction product with a cyclic dicarboxylic anhydride, for example phthalic anhydride, if desired as a mixture with a minor amount of the anhydride of another polybasic carboxylic acid, eg. trimellitic anhydride, in a ratio such that the number of equivalents of OH groups to that of anhydride groups is about 1:1, with formation of the acidic partial esters of the polybasic carboxylic acids, and finally reacting some of the free carboxyl groups of the resulting reaction product with a di- and/or polyglycidyl ether, for example bisphenol A bisglycidyl ether or pentaerythritol triglycidyl ether, in a ratio such that the number of equivalents of COOH groups to that of glycidyl groups is greater than 1:1, preferably from about 1.15:1 to 5:1.

The ethylenically unsaturated, photopolymerizable monomers and/or oligomers chosen are those which are compatible with the N-vinylamide copolymers used as polymeric binders, this choice being obvious to the skilled worker. The ratio of polymeric binder to the ethylenically unsaturated, photopolymerizable compounds in the photopolymerizable recording layer of the novel photosensitive recording elements can be varied within wide limits, and is, for example, from 1:99 to 90:10. A small amount of polymeric binder, for example about 1–35% by weight, based on the photopolymerizable recording layer, is particularly suitable if the said recording layer contains, as ethylenically unsaturated photopolymerizable compound, a large amount, for example 40% by weight or more, in particular more than about 45% by weight, based on the photopolymerizable recording layer, of one or more oligomers containing more than two acryloyl and/or methacryloyl groups and free carboxyl groups.

Suitable photoinitiators for the photopolymerizable recording layers are the photoinitiators or photoinitiator systems which are known per se and are conventionally used for photosensitive, photopolymerizable recording materials. Examples of these are benzoin, benzoin ethers, in particular benzoin alkyl ethers, substituted benzoins, alkyl ethers of substituted benzoins, for example α-methylbenzoin alkyl ethers or α-hydroxymethylbenzoin alkyl ethers; benzils, benzil ketals, in particular benzil dimethyl ketal, benzil methyl ethyl ketal or benzil methyl benzyl ketal; the acylphosphine oxide compounds which are known effective photoinitiators, for example 2,4,6-trimethylbenzoyldiarylphosphine oxide; benzophenone, derivatives of benzophenone, 4,4'-dimethylaminobenzophenone, 4,4'-diethylaminobenzophenone and derivatives of Michler's ketone; anthraquinone and substituted anthraquinones; aryl-substituted imidazoles and their derivatives, eg. 2,4,5-triarylimidazole dimers; 2-chlorothioxanthone and the acridine or phenacine derivatives which are effective photoinitiators. Examples of initiator systems are combinations of the stated initiators with sensitizers or activators, in particular tertiary amines. Typical examples of such initiator systems are combinations of benzophenone or benzophenone derivatives with tertiary amines, such as triethanolamine or Michler's ketone; or mixtures of 2,4,5-triarylimidazole dimers and 2-mercaptobenzoquinazole or the leuko bases of triphenylmethane dyes. The choice of suitable photoinitiators and photoinitiator systems is familiar to the skilled worker. The photoinitiators or photoinitiator systems are present in the photopolymerizable recording layer in general in amounts from 0.001 to 10, preferably from 0.05 to 5, % by weight, based on the said recording layer.

Examples of other suitable additives and/or assistants which may be present in the photopolymerizable recording layer of the novel photosensitive recording elements are thermal polymerization inhibitors, dyes and/or pigments, photochromic compounds or systems, sensitometric regulators, plasticizers, leveling agents dulling agents, lubricants and the like. Examples of suitable thermal polymerization inhibitors are hydroquinone, hydroquinone derivatives, 2,6-di-tert-butyl-p-cresol, nitrophenols, N-nitrosoamines, such as N-nitrosodiphenylamine or the salts of N-nitrosocyclohexylhydroxylamine. Examples of dyes and/or pigments, which may both act as contrast agents and serve to compact the layer, include Brilliant Green Dye (C.I. 42,040), Victoria Sky Blue FGA, Victoria Sky Blue BO (C.I. 42,595), Victoria Blue B (C.I. 44,045), Rhodamine 6 G (C.I. 45,160), triphenylmethane dyes, naphthalimide dyes and 3'-phenyl-7-dimethylamino-2,2'-spiro-di-(2H-1-benzopyran). Photochromicsystems which change their color reversibly or irreversbly on exposure to actinic light without disturbing the photopolymerization process are, for example, leuko dyes together with suitable activators. Examples of leuko dies are the leuko bases of the triphenylmethane dyes, such as crystal violet leuko base and malachite green leuko base, leuko basic blue, leuko pararosaniline and leuko Patent Blue A or V; Rhodamine B base is also suitable. Suitable activators for these photochromic compounds include organic halogen compounds which eliminate halogen radical on exposure to actinic light, and hexaaryl-bisimidazoles. The sensitometric regulators include compounds such as 9-nitroanthracene, 10,10'-bisanthrone, phenazinium, phenoxazinium, acridinium or phenothiazinium dyes, in particular in combination with mild reducing agents, 1,3-d-nitrobenzenes and the like. Suitable plasticizers are the conventional low molecular weight or high molecular weight esters, such as phthalates or adipates, toluenesulfonamide and tricresyl phosphate. The additives and/or assistants are present in the photopolymerizable recording layers in the effective amounts known and conventionally used for these substances. However, their amount should not in general exceed 30, preferably 20, % by weight, based on the photopolymerizable recording layer.

The mixing ratio of the individual components in the photopolymerizable recording layer is in general chosen so that this recording layer not only can be developed in an aqueous alkaline medium but advantageously is also solid and non-tacky at room temperature and has good film formation properties. Where the novel photosensitive recording elements are used as photoresist films, the composition is furthermore chosen so that the photopoymerizable recording layer can readily be laminated, and can be transferred to a substrate with the use of pressure and, if required, heat. The thickness of the photopolymerizable recording layer is known to depend on the intended use of the photosensitive recording elements and can accordingly vary within wide limits. For the production of letterpress or gravure printing plates, the said recording layer is generally from about 100 μm to a few mm thick; for the production of resist images, the thickness of the photopolymerizable recording layer is usually brought to about 1–50 μm; and for lithographic printing plates, the thickness of the photopolymerizable recording layer is generally about 0.5–6 μm.

In a typical embodiment of the invention, the photopolymerizable recording layer of the photosensitive recording elements consists of a homogeneous, film-forming mixture which is soluble or dispersible in aqueous alkaline solutions and comprises (a) from 40 to 90, preferably from 45 to 85, % by weight of one or more carboxyl-containing N-vinylamide coplymers of the abovementioned type which are partially esterified with glycidyl (meth)acrylate, as the polymeric binder, (b) from 5 to 55, preferably from 5 to 45% by weight of one or more ethylenically unsaturated, photopolymerizable monomers which are compatible with the polymeric binder or binders, if necesary as a mixture with a minor amount of one or more compatible, photopolymerizable oligomers in the case of high monomer contents, (c) from 0.001 to 10, preferably from 3 to 7, % by weight of one or more photopolymerization intiators and (d) from 0 to 30, preferably from 0.05 to 20, % by weight of further additives and/or assistants which improve or modify the general properties of the recording elements or of the printing plates orresist images produced from them, for example sensitizers, in general in amounts of from 1 to 4% by weight, dyes, in general in amounts of from 0.5 to 3 % by weight, and conventional plasticizers, for example in amounts from 0.5 to 5, in particular from 1 to 3, % by weight.

As stated above, the photopolymerizable recording layers can, however, also contain less than 40, for example only from 1 to about 35, % by weight, photopolymerizable recording layer, of the polymeric binder or binders. In this case, the said recording layer contains, in addition to the photoinitiator and any further additives and/or assistants, not less than 40, from 45 to 75, % by weight, base polymerizable recording layer, of one or more oligomers which are soluble or dispersible in aqueous alkaline solutions, possess more than two ethylenic, photopolymerizable double bonds, in particular acryloyl and/or methacryloyl groups, and preferably free carboxyl groups and have a mean molecular weight (number average) of about 1,000–10,000. In addition to the photopolymerizible oligomers, the said recording layer can in these cases also contain photopolymerizable monomers, in particular in an amount of about 1–30, preferably about 10–25, % based on the said recording layer. Such photopolymerizable recording layers containing a very small amount of polymeric binder are particularly suitable for thin layers, as are used, for example, in the production of resist images and photo resist films.

Suitable bases for the photopolymerizable recording layers are the dimensionally stable, rigid or, preferably, flexible bases conventionally used for photosensitive recording elements of the type under discussion, the type of base being determined, inter alia, by the intended use of the photosensitive recording elements. Thus, particularly suitable dimensionally stable bases for the production of printing plates are plastic films or sheets, eg. those consisting of polyesters, and metallic bases, for example those consisting of steel or aluminum. Preferably used bases for photoresist films and photosensitive film resist materials are plastic films or sheets, in particular polyester sheets which possess moderate adhesion to the photopolymerizable recording layer and, after lamination of the photopolymerizable recording layer with a substrate, can be peeled off from the said layer, either before or after exposure to actinic light. For the production of resist images, the photopolymerizable recording layer can also be applied directly to the substrate to be protected and, if required, permanently modified, the said substrate the serving as a base for the photopolymerizable recording layer. Examples of suitable substrates for photoresist layers are copper sheets, copper-plated bases, ceramic substrates coated with metallic or metal oxide layers, and semiconductor elements, silicon wafers and the like. The bases for the photopolymerizable recording layers can, if required, be pretreated in a conventional manner, for example mechanically, chemically, electrochemically and/or by coating with an adhesive primer. Furthermore, one or more intermediate layers may also be arranged between the photopolymerizable recording layer and the base. In photosensitive recording elements for the production of printing plates, in particular letterpress or gravure printing plates, these intermediate layers can be in the form of adhesion-promoting layers and/or antihalation layers. In photoresist films and photosensitive film resist materials, an intermediate layer of this type between the photo polymerizable recording layer and the peelable temporary base can facilitate removal of the base by peeling after lamination of the photopolymerizable recording layer with the substrate, and/or serve as an oxygen barrier layer after the base has been peeled off.

A top layer or cover sheet can furthermore be arranged on that surface of the photopolymerizable recording layer which faces away from the base, the said top layer or cover sheet preferably being soluble in the same developer as the photopolymerizable recording layer, or being capable of being peeled off from the recording layer. This top layer or cover sheet serves in particular to protect the photopolymerizable recording layer during storage and handling of the photosensitive recording elements and may also act as an oxygen barrier for the said recording layer. For example, top layers consisting of polyvinyl alcohols or polyvinyl alcohol derivatives and, especially for photoresist films, cover sheets of polyolefins, eg. polyethylene or polypropylene, have proven particularly suitable.

The novel photosensitive recording elements can be produced in a conventional manner by preparing a homogeneous mixture of the components forming the photopolymerizable recording layer and applying this mixture in the form of a layer to the base, which may or may not be provided with an intermediate layer. For example, the components of the said recording layer can be mixed purely mechanically in a suitable mixing apparatus, for example a mixer or extruder, to give a homogeneous mixture, and the latter can be formed, for example by extrusion, calendering or pressing, into a layer of the desired thickness, which is then laminated with the base. Advantageously, however, the photosensitive recording elements are produced by dissolving the components of the photopolymerizable recording layer in a suitable solvent or solvent mixture and applying this solution to the base by casting, immersion, spraying or another known application technique, to give a layer of the desired thickness. The solvent is then removed in a conventional manner, and the photopolymerizable recording layer is dried. Suitable solvents for mixing the components and applying the photopolymerizable recording layer to the base include lower alcohols, ketones or esters, eg. methanol acetone, methyl ethyl ketone, ethyl acetate and the like, as well as mixtures of these. If desired, the top layer or cover sheet can then also be applied to the photopolymerizable recording layer.

The novel photosensitive recording elements can advantageously be used for the production of printing plates or resist images by the methods conventionally used for this purpose. To do this, the photopolymerizable recording layer is exposed imagewise to actinic light, this being done after lamination with the substrate to be protected in the case of photoresists films and photosensitive film resist materials; suitable light sources for this purpose are the conventional sources of actinic light, for example UV fluorescent tubes, high pressure, medium pressure or low pressure mercury lamps, superactinic fluorescent tubes and pulsed xenon lamps, as well as UV lasers, argon lasers and the like. The wavelength emitted by the light sources should be in general from 230 to 450 nm, preferably from 300 to 420 nm, and should in particular be matched up with the individual absorption of the photoinitiator present in the photopolymerizable recording layer.

The imagewise exposure to actinic light initiates photopolymerization in the exposed areas qf the recording layer, this photopolymerization leading to crosslinking in the exposed areas of the layer and hence solubility differentiation between the exposed and unexposed areas of the layer. After the imagewise exposure, the printing plate or the resist image is developed by washing out the unexposed, noncrosslinked areas of the recording layer with an aqueous alkaline developer. Development can be carried out by washing, spraying, rubbing, brushing etc. The novel recording elements exhibited a side development latitude and very little sensitivity to overwashing. Suitable developers are aqueous alkaline solutions which contain alkaline substances, e.g. borax, disodium hydrogen phosphate, sodium carbonate, an alkali metal hydroxide or an organic base, such as di- or triethanolamine, in solution in water, in order to bring the pH to the most advantageous value, in general from 8 to 14, preferably from about 9 to 13. The aqueous alkaline developers may also contain buffer salts, for example water-soluble alkali metal phosphates, silicates, borates, acetates or benzoates. Wetting agents, preferably an ionic wetting agents, and, if required, water-soluble polymers, eg. sodium carboxymethylcelluloe, polyvinyl alcohol, polysodium acrylate and the like, may also be used as further components of the developers. Although the novel recording elements are generally washed out with purely aqueous alkaline developers, it is of course possible in principle, although not necessary, for the aqueous alkaline developers also to contain small amounts of added water-soluble organic solvents, or example aliphatic alcohols, acetone or tetrahydrofuran.

The novel photosensitive recording elements are distinguished by their good exposure proprties and good devetlopability in aqueous alkaline developers, making it possible to reproduce even very fine image elements faithfully to the original and reliably. The novel photopolymerizable recording layers exhibit excellent adhesion to metallic or metal oxide substrates, without deposits of residual layer material being formed in the washed out areas during development of the imagewise exposed recording layer. The recording elements in the exposed ie. photocrosslinked, state are also very resistant to aqueous media, as are used, for example, in conjunction with printing plates or resist images. The novel photosensitive recording materials are suitable in principle for all appli cations in reprography and in optical information fixing.

The novel photosensitive recording elements have substantially improved photosensitivity. Consequently, some presensitized offset plates without a PVAL protective film have shorter exposure times than prior art plates.

Because of the intermolecular crosslinking of the binder, extremely large increases in molelular weight are achieved, this being manifested in the improved stability of the offset layer.

Photopolymeric offset layers based on the novel photosensitive recording elements and carrying a PVAL protective film can be written on by means of suitable for the computer-to-plate production of printing plates.

The Examples which follow illustrate the invention. In the Examples, parts and percentages are by weight, unless stated otherwise. Modification of a carboxyl-containing copolymer with glycidyl (meth)acrylate.

A copolymer (Fikentscher K value 27) of 67.5% of methyl methacrylate, 22.5% of N-vinylpyrrolidone and 10% of methacrylic acid is dissolved in diethylene glycol dimethyl ether in a reaction vessel to give a solution having a solids content of 15%. This solution is heated to 110° C., and a solution of 30 parts of glycidyl methacrylate, 2 parts of a thermal polymerization inhibitor (eg. Xyligen ® A1) and 2 parts of an esterification catalyst (eg. dimethylaminopyridine, N-methylimidadole or tetrabutylammonium iodide) is uniformly added dropwise at this temperature in the course of 2 hours. The reaction is complete after about 3.5 hours. After cooling, the resulting reaction mixture is diluted to a solids content of 3% and the copolymer is precipitated in water and dried at 50° C. under reduced pressure from an oil pump. The resulting copolymer has an acid number of 25 mg of KOH/g.

EXAMPLE 1

59% of the carboxyl-containing copolymer described above, modified with glycidyl methacrylate and having an acid number of 25, 30% of a monomer (diacrylate of 1,4-butanediol diglycidyl ether), 2% of Michler's ketone, 6% of 2-(4'-methoxynaphth-1'-yl)-4,6-bis-(trichloromethyl)-s-triazine, 1% of bromophenol blue and 2% of a plasticizer (benzenesulfonic acid n-butylamide) were processed to a 5% strength solution in tetrahydrofuran, and the homogeneous solution was applied, by means of a knife coater (casting slot 35 µm, take-off speed 250 ml/minute), to electrolytically roughened and anodically oxidized aluminum minum bases, as typically used for lithographic printing plates. Drying for 10 minutes at 80° C. gale, in each case, a photopolymerizable layer which was 2.5 µm thick (about 2.7 g/m²). The lithographic printing plates produced in this manner (without an oxygen barrier layer) initially remained for 6 days in a closed bag. The were exposed to actinic light through a FOGRA PMS test strip to determine the minimum exposure time required. After exposure, the plates were developed for 50 seconds with an aqueous alkaline developer (pH 12.5).
Properties of the recording elements:
PVAL-free:
Exposure time: 25 seconds (to 3 kW Hg lamp)
Resolution: K value (according to FOGRA) 10 µm
Color change: Good

EXAMPLE 2

Example 1 was repeated, except that an oxygen barrier layer consisting of a polyvinyl alcohol (degree of hydrolysis about 98%) was applied, as a 5 µm thick layer (about 6 g/m²), to the free surface of the photopolymerizable layer of the lithographic printing plates directly after drying. For these lithographic printing plates possessing an oxygen carrier layer, the required minimum exposure time and the achievable resolution were determined in the same way as for the plates without an oxygen barrier layer, by imagewise exposure to actinic light through the FOGRA PMS test strip.
Properties:
Exposure time: 1 second
Resolution: K value (according to FOGRA) 15–20 µm
Color change: Small

EXAMPLE 3

Example 1 was repeated, except that 20% of monomer was used instead of 30%, and 69% of the binder instead of 59%.
Properties:
Exposure time: 45 seconds
Resolution: K value (according to FOGRA) 12 µm
Color change: Good

EXAMPLE 4

The procedure described in Example 2 was followed, except that 40% of trimethylolpropane triacrylate was used instead of 30% of the diacrylate of 1,4-butanediol diglycidyl ether, 49% of the binder was used instead of 59%, and Victoria Blue was used instead of bromophenol blue.
Properties of the resulting recording element:
Sensitivity: 0.6 mJ cm$^{-2}$
Resolution: K value (according to FOGRA) 12 µm
This recording element is also suitable for exposure to a laser (351 nm, argon+ laser).

We claim:
1. A photosensitive recording element for the production of printing plates and resist images comprising
   (a) a dimensionally stable base and
   (B) a photopolymerizable recording layer consisting essentially of the following components:
     (B1) at least one film-forming copolymer having a mean weight average molecular weight greater than about 10,000, possessing carboxyl groups and being soluble or dispersable in aqueous alkaline solution, said carboxyl groups being 10 to 60% esterified by reaction with glycidyl acrylate, glycidyl methacrylate or mixture thereof, the polymer main chain of said copolymer consisting of the following copolymerized units:
       (a) from 10 to 50% by weight, based on the sum of all the copolymerized units present, of at least one N-vinylamide selected from the group consisting of the N-vinyl derivatives of the aliphatic carboxamides and of the N-vinyllactams,
       (b) from 8 to 30% weight, based on the sum of all copolymerized units present, of acrylic acid, methacrylic acid, or mixture thereof, and
       (c) from 30 to 80% by weight, based on the sum of all copolymerized units present, of vinyl aromatics, vinylacetate, esters of acrylic acid or methacrylic acid or mixtures thereof,

(B2) at least one ethylenically unsaturated photopolymerizable compound compatible with the said copolymer (B1) and selected from the group consisting of non-gaseous, ethylenically unsaturated, photopolymerizable monomers of a molecular weight of less than 1,000 and photopolymerizable oligomers having a mean number average molecular weight of about 1,000 to 10,000, and (B3) at least one photoinitiator.

2. The photosensitive recording element of claim 1 wherein the copolymer (B1), whose carboxyl groups are 10-60% esterified, has an acid number of from 20 to 100 mg of KOH/g.

3. The photosensitive recording element of claim 1 wherein the said N-vinylamide is an N-vinyllactam selected from the group consisting of N-vinylpyrrolidone and N-vinylcaproactam.

4. The photosensitive recording element of claim 1 wherein said photopolymerizable recording layer consists essentially of 40-90% by weight of said at least one film-forming copolymer (B1) 5-55% by weight of said at least one ethylenically unsaturated, photopolymerizable compound (B2) and 0.001 to 10% by weight of said at least one photoinitiator (B3).

* * * * *